(12) United States Patent
Matsumoto

(10) Patent No.: US 11,811,041 B2
(45) Date of Patent: Nov. 7, 2023

(54) POWER SUPPLY SYSTEM

(71) Applicant: KABUSHIKI KAISHA TOYOTA JIDOSHOKKI, Kariya (JP)

(72) Inventor: Yusuke Matsumoto, Aichi-ken (JP)

(73) Assignee: KABUSHIKI KAISHA TOYOTA JIDOSHOKKI, Kariya (JP)

(*) Notice: Subject to any disclaimer, the term of this patent is extended or adjusted under 35 U.S.C. 154(b) by 48 days.

(21) Appl. No.: 17/330,874

(22) Filed: May 26, 2021

(65) Prior Publication Data

US 2021/0391613 A1 Dec. 16, 2021

(30) Foreign Application Priority Data

Jun. 16, 2020 (JP) .................. 2020-103737

(51) Int. Cl.
*H01M 10/6568* (2014.01)
*H01M 10/613* (2014.01)
*H01M 10/6552* (2014.01)
*H01M 10/6556* (2014.01)
*H01M 50/209* (2021.01)
*H05K 7/20* (2006.01)
*H01M 10/6557* (2014.01)

(52) U.S. Cl.
CPC ..... *H01M 10/6568* (2015.04); *H01M 10/613* (2015.04); *H01M 10/6552* (2015.04); *H01M 10/6556* (2015.04); *H01M 50/209* (2021.01); *H05K 7/20327* (2013.01); *H05K 7/20354* (2013.01)

(58) Field of Classification Search
CPC . B60L 50/64; H01M 10/6568; H01M 10/613; H01M 10/6552; H01M 10/6556; H01M 10/647; H01M 10/6557; H01M 10/6563; H01M 10/66; H05K 7/20354; H05K 7/20327
See application file for complete search history.

(56) References Cited

U.S. PATENT DOCUMENTS

2013/0255293 A1* 10/2013 Gadawski ......... H01M 10/6555
429/62
2014/0023906 A1* 1/2014 Hashimoto ......... H01M 50/271
429/157
2015/0365008 A1 12/2015 Ogino et al.
(Continued)

FOREIGN PATENT DOCUMENTS

JP 6010212 B2 10/2016
JP 6019212 B2 * 11/2016 ............. F25D 19/00
JP 2017-195104 A 10/2017

*Primary Examiner* — Pamela H Weiss
*Assistant Examiner* — Amanda Rosenbaum
(74) *Attorney, Agent, or Firm* — Sughrue Mion, PLLC

(57) ABSTRACT

A power supply system includes a plurality of batteries, a cooling portion through which a refrigerant for cooling the plurality of the batteries flows, a housing that has a bottom plate, a top plate, and side walls, the housing accommodating the plurality of the batteries and the cooling portion, and a compressor configured to pump the refrigerant to the cooling portion. In the housing, a strength member that extends in a direction in which the side walls face each other and reinforces the housing is mounted on the bottom plate or the top plate. The compressor is disposed in a position in which the compressor and the strength member are overlapped in the upright direction of the side walls.

5 Claims, 5 Drawing Sheets

(56) References Cited

U.S. PATENT DOCUMENTS

2015/0380784 A1* 12/2015 Bass ................ H01M 10/6569
                                                    429/120
2016/0297290 A1* 10/2016 Murata .................... B60K 1/04
2019/0097280 A1*  3/2019 You ..................... H01M 10/627
2019/0140327 A1   5/2019 Fukada ............... H01M 10/617
2020/0313130 A1* 10/2020 Eulitz ................ H01M 50/227

* cited by examiner

POWER SUPPLY SYSTEM

CROSS-REFERENCE TO RELATED APPLICATION

This application claims priority to Japanese Patent Application No. 2020-103737 filed on Jun. 16, 2020, the entire disclosure of which is incorporated herein by reference.

BACKGROUND ART

The present disclosure relates to a power supply system.

Conventionally, a power supply system in which a plurality of batteries and a cooling mechanism configured to circulate a refrigerant for cooling the batteries are accommodated in a housing has been used. Japanese Patent No. 6019212 discloses a configuration of a power supply system in which an evaporative cooling member and a compressor configured to pump a refrigerant to the cooling member are disposed in a housing, and a plurality of batteries is arranged on the cooling member. With this configuration, the batteries on the cooling member are cooled via the refrigerant that is pumped by the compressor, thereby suppressing that the batteries have a high temperature.

On the other hand, when the power supply system receives an impact from outside, the batteries and the cooling member inside the power supply system may be damaged. Especially, the power supply system that is mounted on a moving medium such as a vehicle easily receives the impact from the outside. Accordingly, it is required to increase strength of the housing of the power supply system so as to prevent the batteries and the like from being damaged. However, in the configuration disclosed in the Publication, increasing a thickness of a plate material that forms the housing to increase the strength of the housing is not preferable since weight of the housing and a manufacturing cost are also increased. In a case in which a strength member that increases the strength of the housing is provided in the housing, there is an expectation that an increase of the weight of the housing and the manufacturing cost are further suppressed in this case than in a case in which the thickness of the plate material is increased. However, simply mounting the strength member to the housing increases size of the housing by the size of the strength member, thereby causing a fear that a space on which the power supply system is placed is enlarged. Since the power supply system is disposed in a limited space in many cases, enlarging the space for placement of the power supply system is not preferable.

The present disclosure has been made in view of the above circumstances and is directed to providing a power supply system in which while enlargement of a space for placement of the power supply system is suppressed, strength of a housing is improved.

SUMMARY

In accordance with an aspect of the present disclosure, there is provided a power supply system that includes a plurality of batteries, a cooling portion through which a refrigerant for cooling the plurality of the batteries flows, a housing that has a bottom plate, a top plate, and side walls that extend upright from a peripheral edge of the bottom plate to a peripheral edge of the top plate, the housing accommodating the plurality of the batteries and the cooling portion, and a compressor configured to pump the refrigerant to the cooling portion. In the housing, a strength member that extends in a direction in which the side walls face each other and reinforces the housing is mounted on the bottom plate or the top plate. The compressor is disposed in a position in which the compressor and the strength member are overlapped in the upright direction of the side walls.

Other aspects and advantages of the disclosure will become apparent from the following description, taken in conjunction with the accompanying drawings, illustrating by way of example the principles of the disclosure.

BRIEF DESCRIPTION OF THE DRAWINGS

The disclosure, together with objects and advantages thereof, may best be understood by reference to the following description of the embodiments together with the accompanying drawings in which.

DETAILED DESCRIPTION OF THE EMBODIMENTS

First Embodiment

Figure 1:
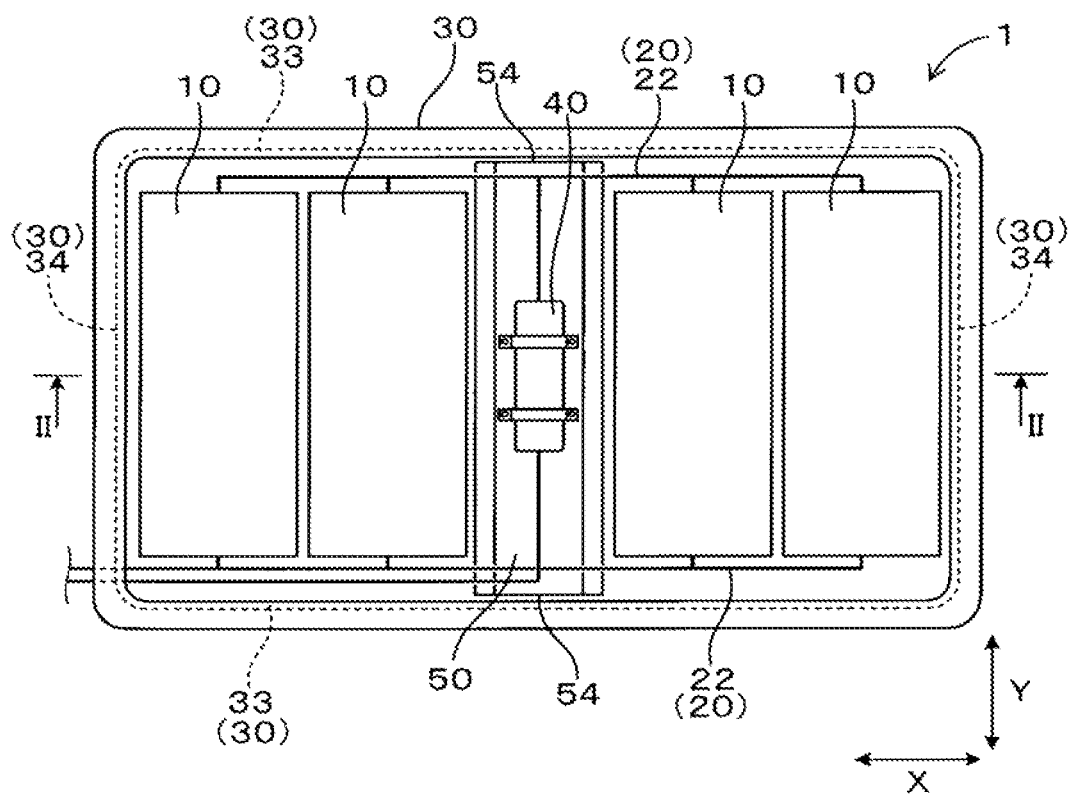
FIG. 1 is a top view of a power supply system in which a top plate is removed according to a first embodiment of the present disclosure.
Figure 2:
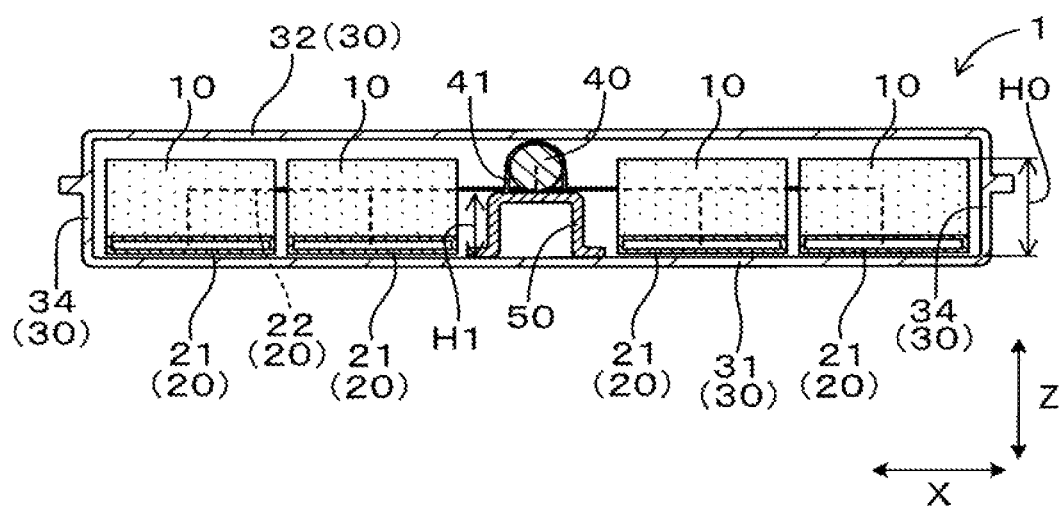
FIG. 2 is a cross-sectional view taken along a line Il-Il of FIG. 1.
Figure 3:
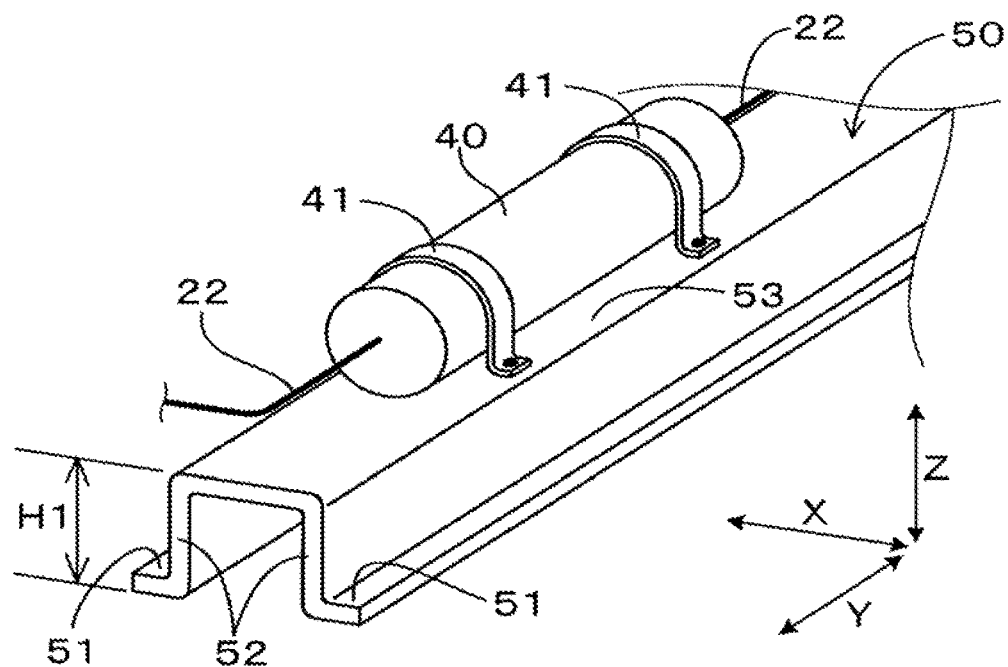
FIG. 3 is a perspective view schematically illustrating a state in which a compressor is mounted to a strength member in the power supply system according to the first embodiment.

The following will describe a power supply system according to a first embodiment of the present disclosure with reference to FIGS. 1 to 3.

A power supply system 1 of the present embodiment includes batteries 10, a cooling portion 20, a housing 30, a compressor 40, and a strength member 50, as illustrated in FIGS. 1 and 2.

The power supply system 1 includes a plurality of the batteries 10.

A refrigerant for cooling the batteries 10 flows through the cooling portion 20.

The housing 30 has a bottom plate 31, a top plate 32, and side walls 33, 34 that extend upright from a peripheral edge of the bottom plate 31 to a peripheral edge of the top plate 32. The housing 30 accommodates the plurality of batteries 10 and the cooling portion 20.

The compressor 40 is configured to pump the refrigerant to the cooling portion 20.

In the housing 30, the strength member 50 that extends in a direction in which the side walls 33 face each other and reinforces the housing 30 is mounted on the bottom plate 31 or the top plate 32.

As illustrated in FIG. 2, the compressor 40 is disposed in a position in which the compressor 40 and the strength member 50 are overlapped in the upright direction of the side walls 33.

The following will describe the power supply system 1 according to the present embodiment in detail.

As illustrated in FIGS. 1 and 2, in the power supply system 1, the housing 30 accommodates the batteries 10. The housing 30 is formed in a flat box shape, and includes the bottom plate 31, the top plate 32, and the side walls 33, 34, as illustrated in FIG. 2. Both of the bottom plate 31 and the top plate 32 are formed in a rectangular shape in a plan view. The side walls 33, 34 extend upright from the peripheral edge of the bottom plate 31 to the peripheral edge of the top plate 32. This means that a space between the bottom plate 31 and the top plate 32 is enclosed with the side walls 33, 34 in a circumferential direction of the housing 30. A material of the housing 30 is not limited in particular, but the housing is preferably made of metal that has high rigidity, and may be made of resin. It is noted that in the present embodiment, as illustrated in FIG. 1, a direction parallel with longitudinal sides of the bottom plate 31 and the top plate 32 is defined as a transverse direction X, and a direction parallel with short sides of the bottom plate 31 and the top plate 32 is defined as a lengthwise direction Y. The upright direction of the side walls 33, 34 is defined as a height direction Z, as illustrated in FIG. 2.

As illustrated in FIGS. 1 and 2, the power supply system 1 includes the plurality of batteries 10, that is, four batteries 10 in the present embodiment. The number of the batteries 10 is not limited. Instead of four batteries 10 in the present embodiment, the power supply system 1 may include two or three batteries 10, or five or more batteries 10. Each of the batteries 10 constitutes a secondary battery that includes a cell being chargeable/dischargeable. It is noted that the battery 10 may be a battery module that includes a plurality of cells, or a battery that includes a single cell. In the present embodiment, as illustrated in FIG. 1, the batteries 10 are each formed in a rectangular shape in a plan view, and arranged at specified intervals with short sides of the batteries 10 being in a line so that a longitudinal direction of the batteries 10 is parallel with the lengthwise direction Y of the housing 30. As illustrated in FIG. 2, the four batteries 10 are arranged in the transverse direction X on the bottom plate 31. It is noted that arrangement of the batteries 10 is not limited to the arrangement of the present embodiment, and the batteries 10 may be arranged at specified intervals with the short sides of the batteries 10 being in a line so that the longitudinal direction of the batteries 10 is parallel with the transverse direction X of the housing 30.

As illustrated in FIGS. 1 and 2, the cooling portion 20 includes cooling pipes 21 and a cooling piping 22. The cooling portion 20 includes a plurality of the cooling pipes 21 that are each disposed in the corresponding battery 10 of the batteries 10 in the present embodiment. As illustrated in FIG. 2, each of the cooling pipes 21 is formed in a flat hollow shape, and has a refrigerant passage through which the refrigerant flows. In the present embodiment, the cooling pipes 21 are disposed in such a manner that the cooling pipes 21 are in contact with bottom faces of the batteries 10. The cooling piping 22 is connected to the cooling pipes 21, the compressor 40 that is described later, and a capacitor (not illustrated). The cooling piping 22 is formed in a pipe shape, and the refrigerant may flow through the cooling piping 22. It is noted that the cooling piping 22 includes not only the compressor 40 but also a radiator (not illustrated) configured to dissipate heat of the batteries 10 to the outside and a sensor (not illustrated) configured to detect a temperature of the refrigerant. In addition, the cooling piping 22 may include an accumulator configured to store the refrigerant under pressure.

The strength member 50 is disposed on the bottom plate 31 or the top plate 32 of the housing 30. The strength member 50 may be provided separately from or integrally formed with the housing 30. In the present embodiment, as illustrated in FIG. 2, the strength member 50 is provided separately from the housing 30. With this configuration, machining such as making a hole in the housing 30 is not required, wherein the machining is performed so as to mount the compressor 40 to the strength member 50 as described later, so that reduction in seal performance of the housing 30 may be suppressed. In the present embodiment, the strength member 50 is fixed to the bottom plate 31 by welding. Thus, even when the strength member 50 is mounted on the housing 30, the machining such as making a hole in the housing 30 is not required, so that the reduction in the seal performance of the housing 30 may be suppressed. It is noted that the strength member 50 and the housing 30 may be integrally formed with each other by forming the strength member 50 in a rib shape by bending the bottom plate 31 or the top plate 32 inward of the housing 30.

In the present embodiment, the strength member 50 is formed by bending a metal plate material. As illustrated in FIG. 3, the strength member 50 has connecting portions 51 that are disposed in opposite ends of the bent plate material in a width direction perpendicular to a longitudinal direction of the bent plate material and welded to the bottom plate 31, leg portions 52 that are bent and extend upright in the height direction Z from the connecting portions 51 that are disposed in the opposite ends, and an upper face portion 53 that is bent inward of upper ends of the leg portions 52 in the transverse direction X. As illustrated in FIG. 1, the strength member 50 extends in the lengthwise direction Y that is the facing direction of the side walls 33 that face each other in the housing 30. Thus, the strength member 50 and the plurality of batteries 10 are arranged substantially parallel with each other with the longitudinal directions of the strength member 50 and the batteries 10 oriented in the same direction.

As illustrated in FIGS. 1 and 2, the strength member 50 is located between adjacent two of the batteries 10 arranged in the transverse direction X. In the present embodiment, the strength member 50 is located between the two batteries 10 that are located in a middle portion in a direction in which the batteries 10 are arranged. With this configuration, the strength member 50 is disposed in the facing direction of a pair of the side walls 33 in an area near the middle portion of the housing 30, thereby facilitating improvement of strength of the housing 30. In the present embodiment, as illustrated in FIGS. 2 and 3, a height H1 of the strength member 50 from the bottom plate 31 is smaller than a height H0 of each of the batteries 10 from the bottom plate 31. This means that a distance between the strength member 50 and the top plate 32 is larger than that between each of the batteries 10 and the top plate 32. As illustrated in FIG. 1, in the present embodiment, distances between the side walls 33 and opposite ends 54 of the strength member 50 in the lengthwise direction Y, wherein the opposite ends 54 are not in contact with the side walls 33 of the housing 30, are sufficiently smaller than those between the side walls 33 and ends of the batteries 10 in the lengthwise direction Y. This means that a length of the strength member 50 in a direction in which the strength member 50 extends is larger than that of each of the batteries 10 in the longitudinal direction thereof. With this configuration, even when the side walls 33 are deformed in such a manner that the side walls 33 are bent inward of the housing 30 by external force, the side walls 33 are brought into contact with the ends 54 of the strength member 50, which prevents the side walls 33 from being further deformed. As a result, the side walls 33 are not brought into contact with the batteries 10. It is noted that the power supply system 1 may include a plurality of the strength members 50.

As illustrated in FIGS. 1 and 2, the compressor 40 is disposed in the position in which the compressor 40 and the strength member 50 are overlapped in the height direction Z that is the upright direction of the side walls 33 of the housing 30. In the present embodiment, as illustrated in FIGS. 2 and 3, the compressor 40 is fixed to the upper face portion 53 of the strength member 50 by fastening members 41 that are each formed in a strip shape. The compressor 40 is configured to pump the refrigerant to the cooling portion 20. In the present embodiment, as illustrated in FIGS. 1 and 3, the cooling piping 22 is connected to opposite ends of the compressor 40 in the lengthwise direction Y. The refrigerant is pumped by the compressor 40 and circulated to the cooling pipes 21 through the cooling piping 22 to be circulated.

A shape of the compressor 40 is not limited. For example, the compressor 40 may be formed in a columnar shape such as a round column shape and a quadrangular column shape. In the present embodiment, as illustrated in FIGS. 1 and 3, the compressor 40 is formed in a substantially round column shape. The compressor 40 is fixed to the strength member 50 with a longitudinal direction of the compressor 40 being same as the lengthwise direction Y that is the extension direction of the strength member 50. A length of the compressor 40 in the transverse direction X is smaller than that of the upper face portion 53 of the strength member 50 in the transverse direction X, and a length of the compressor 40 in the lengthwise direction Y is also smaller than that of the strength member 50 in the lengthwise direction Y. In other words, the upper face portion 53 of the strength member 50 is larger than the compressor 40 in the transverse direction X and the lengthwise direction Y. With this configuration, as illustrated in FIG. 1, in a view in the height direction Z, the whole compressor 40 is within the upper face portion 53 of the strength member 50, and does not protrude from the upper face portion 53.

The following will describe advantageous effects of the power supply system 1 according to the present embodiment in detail.

In the power supply system 1 of the present embodiment, the strength of the housing 30 is increased due to the strength member 50 that extends in the facing direction of the side walls 33 that face each other. The compressor 40 that is configured to pump the refrigerant is disposed in such a manner that the compressor 40 and the strength member 50 are overlapped in the upright direction of the side walls 33 of the housing 30. This configuration reduces a projected area of the whole power supply system 1 when the power supply system 1 is projected in the upright direction of the side walls 33 of the housing 30, so that enlargement of a space for placement when the power supply system 1 is placed in the upright direction of the side walls 33 may be suppressed.

In the present embodiment, the plurality of batteries 10 are arranged on the bottom plate 31 in the transverse direction X perpendicular to the direction in which the strength member 50 extends. The cooling portion 20 includes the plurality of cooling pipes 21 that are in contact with at least one of the batteries 10 and the cooling piping 22 that is connected to the cooling pipes 21 and the compressor 40 and through which the refrigerant flows to the cooling pipes 21 to be circulated. The strength member 50 is located between the adjacent two of the batteries 10. Thus, the compressor 40 that is disposed in the position that the compressor 40 and the strength member 50 are overlapped is located between the adjacent two of the batteries 10. With this configuration, differences among flow distances from the compressor 40 to each of the cooling pipes 21 in the cooling piping 22 may be smaller. This may reduce non-uniformity of a cooling effect of the battery 10 in each of the cooling pipes 21 and simplify a configuration of the cooling piping 22.

In the present embodiment, the compressor 40 is accommodated in the housing 30, and located in a space formed between the strength member 50 and the top plate 32. With this configuration, the space in the housing 30 is effectively used, so that it is achieved that enlargement of the space for placement is suppressed.

In the present embodiment, the compressor 40 is directly fixed to the strength member 50. Thus, the strength of the strength member 50 is increased by fixing the compressor 40 that has relatively high stiffness to the strength member 50. As a result, the strength of the housing 30 may be further increased without mounting a new strength member and increasing a thickness of a material of the housing 30. In addition, since the compressor 40 is fixed to the strength member 50 that has high strength, the compressor 40 is easily fixed and stability of a fixed state of the compressor 40 is increased.

Figure 4:
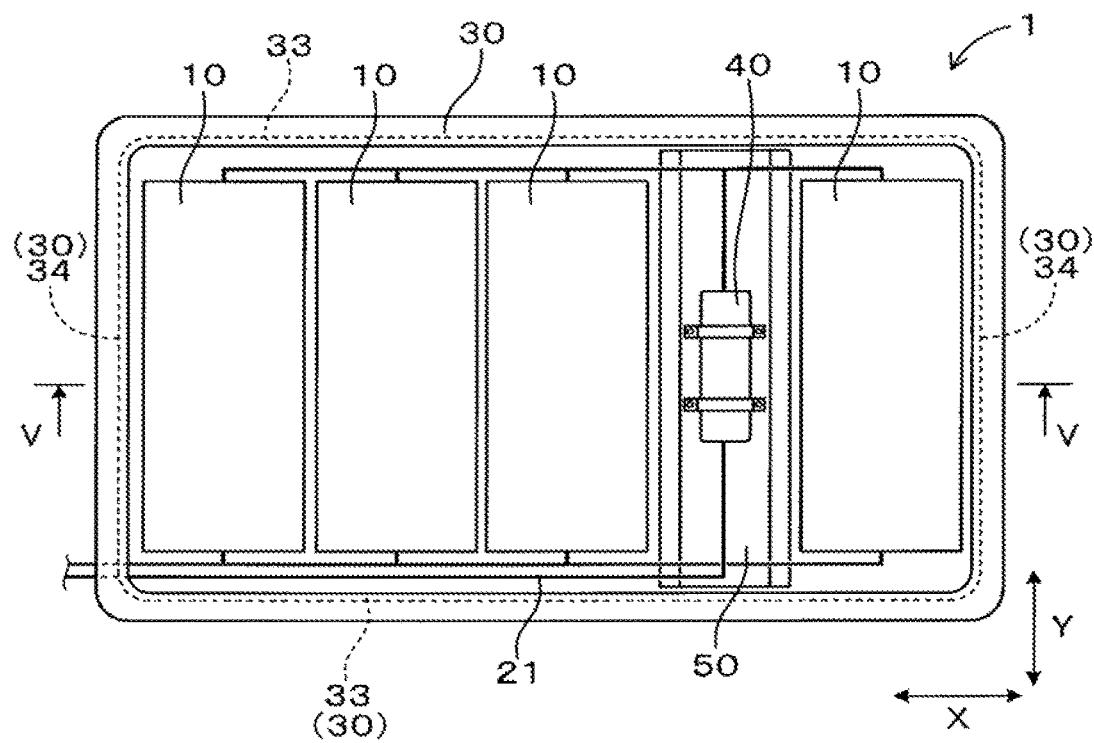
FIG. 4 is a top view of a power supply system in which a top plate is removed in the power supply system according to a first modified embodiment of the present disclosure.
Figure 5:
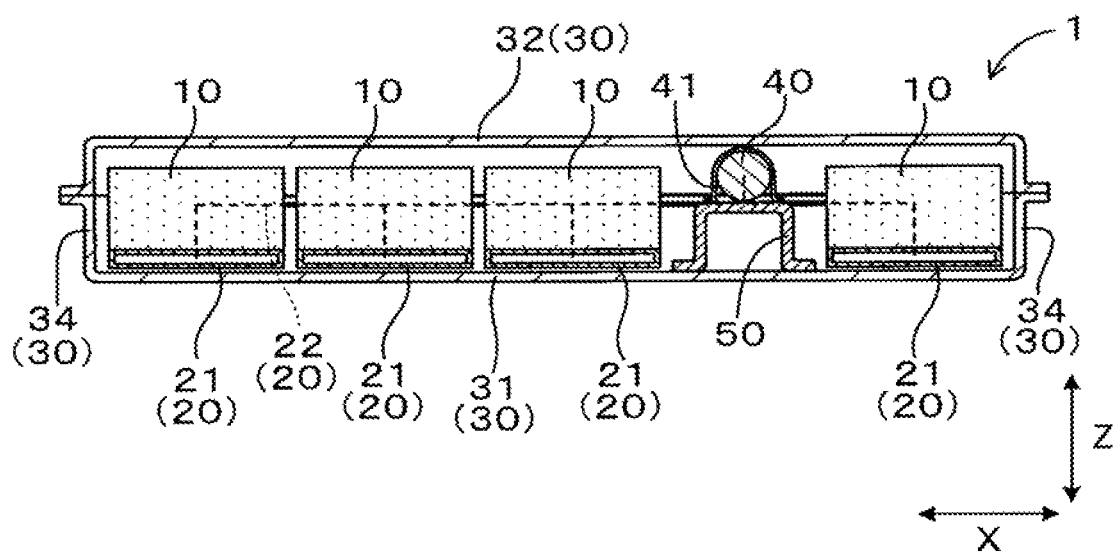
FIG. 5 is a cross-sectional view taken along a line V-V of FIG. 4 according to the first modified embodiment.

It is noted that in the present embodiment, the strength member 50 is located between the two batteries 10 that are located in the middle portion in the direction in which the plurality of batteries 10 are arranged. However, the present disclosure is not limited to this embodiment. The strength member 50 may be located between adjacent two of the batteries 10 other than the two batteries 10 that are located in the middle portion. For example, as a first modified embodiment illustrated in FIGS. 4 and 5, the strength member 50 may be located between the battery 10 that is located in either end in the direction in which the batteries 10 are arranged and the battery 10 adjacent to it. In the first modified embodiment, the differences among the flow distances from the compressor 40 to each of the cooling pipes 21 are reduced in some degree, although such differences are larger than those in the first embodiment. Thus, the first modified embodiment provides the same advantageous effects as those of the first embodiment.

Figure 6:
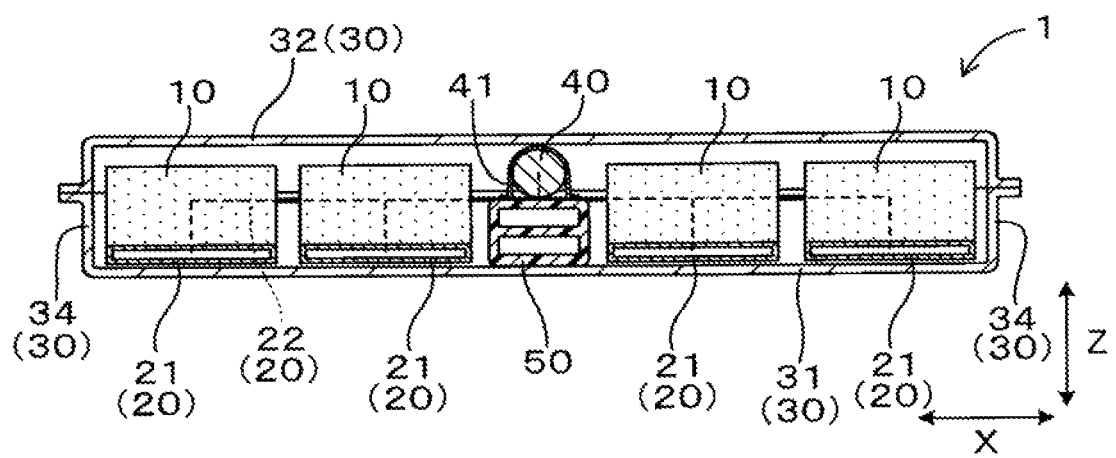
FIG. 6 is a cross-sectional view taken along a line corresponding to the line V-V of FIG. 4 according to a second modified embodiment.
Figure 7:
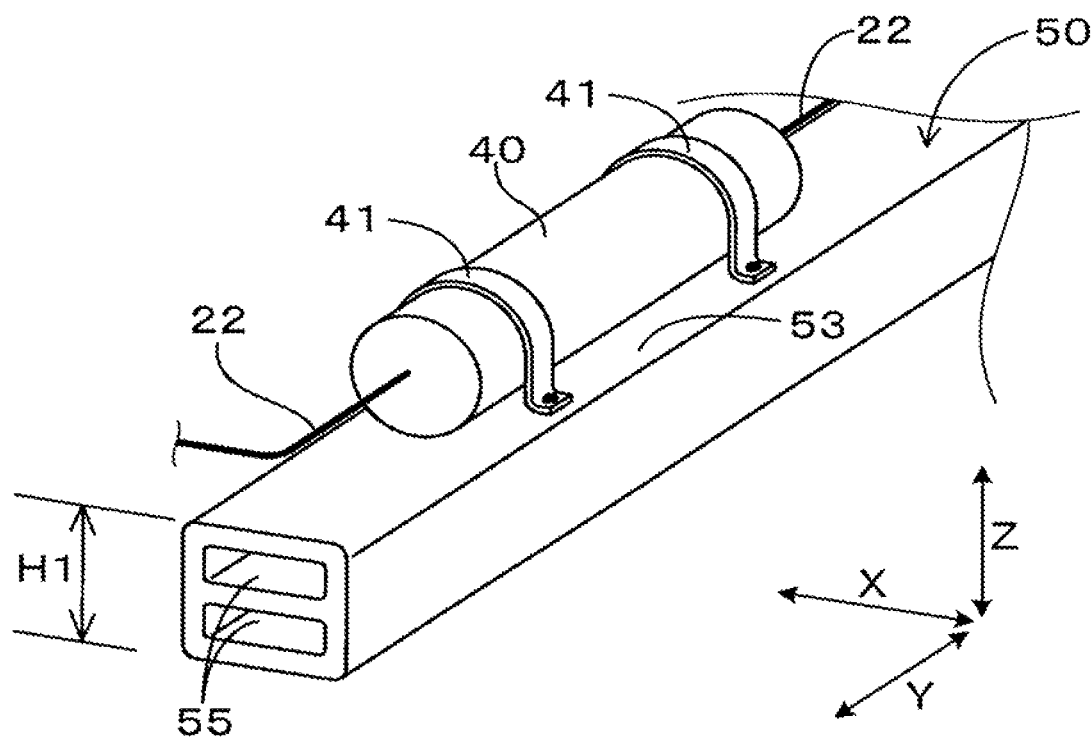
FIG. 7 is a perspective view schematically illustrating a state in which a compressor is mounted to a strength member in a power supply system according to the second modified embodiment.

It is noted that although in the present embodiment, the strength member 50 is formed by bending the metal plate material, instead of this, in a second modified embodiment illustrated in FIGS. 6 and 7, the strength member 50 is formed by extrusion processing on a resin material. The strength member 50 has hollow portions 55 that extend in the lengthwise direction Y. This configuration achieves reduction in weight and cost of the material. The second modified embodiment provides the same advantageous effects as those of the first embodiment.

Figure 8:
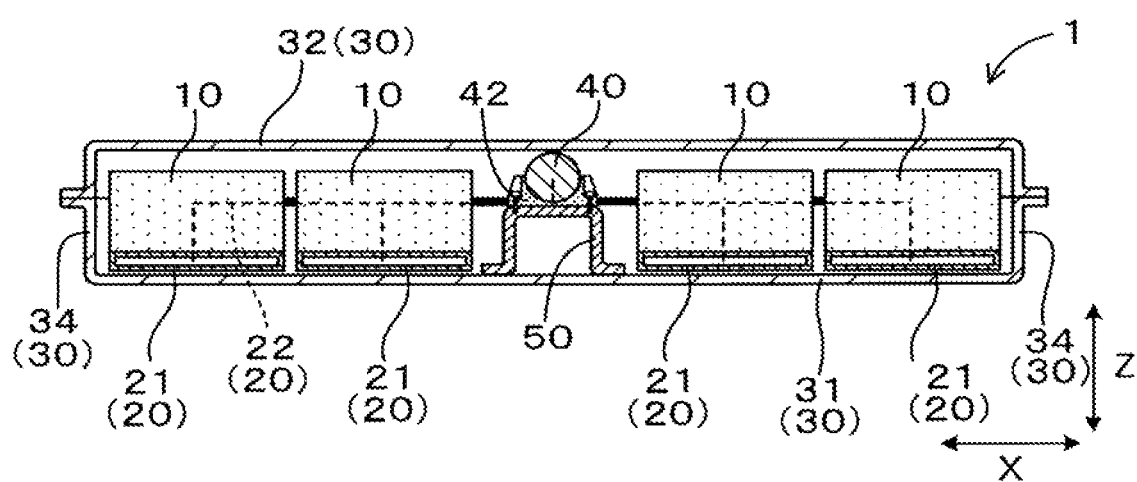
FIG. 8 is a cross-sectional view taken along a line corresponding to the line V-V of FIG. 4 according to a third modified embodiment.

In the present embodiment, the compressor 40 is directly fixed to the strength member 50 by the fastening members 41. Instead of this, in a third modified embodiment illustrated in FIG. 8, the compressor 40 is fixed to the strength member 50 via a bracket 42 that is made of resin. The third modified embodiment provides the same advantageous effects as those of the first embodiment.

Figure 9:
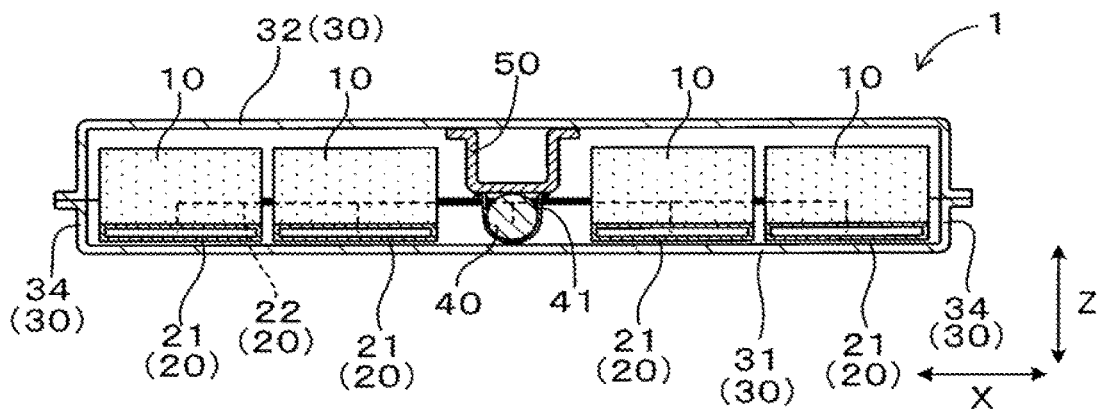
FIG. 9 is a cross-sectional view taken along a line corresponding to the line V-V of FIG. 4 according to a fourth modified embodiment.

In the present embodiment, the strength member 50 is mounted on the bottom plate 31 of the housing 30. Instead of this, in a fourth modified embodiment illustrated in FIG. 9, the strength member 50 is mounted on the top plate 32 of the housing 30. The compressor 40 is located in a space between the strength member 50 and the bottom plate 31, and mounted on the strength member 50. The fourth modified embodiment provides the same advantageous effects as those of the first embodiment.

Figure 10:
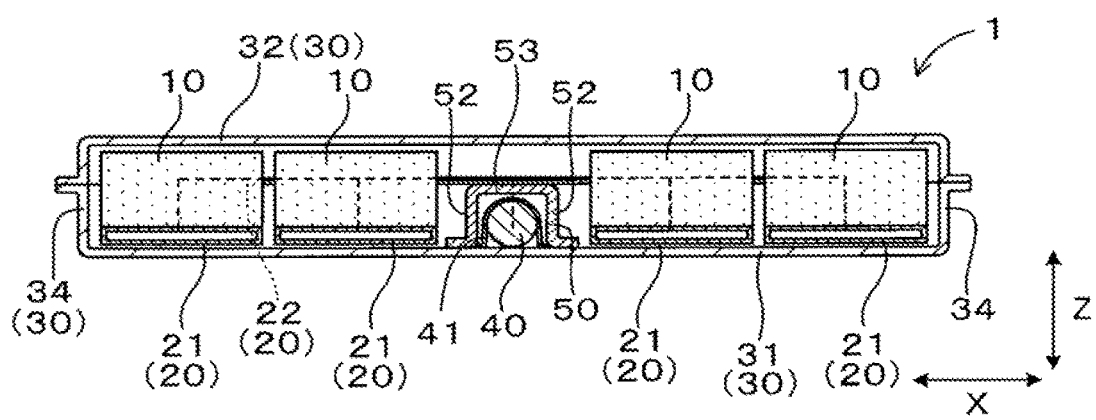
FIG. 10 is a cross-sectional view taken along a line corresponding to the line V-V of FIG. 4 according to a fifth modified embodiment.

In the present embodiment, the compressor 40 is mounted on the upper face portion 53 of the strength member 50. Instead of this, in a fifth modified embodiment illustrated in FIG. 10, the compressor 40 is located in a space that is enclosed with the leg portions 52 and the upper face portion 53 of the strength member 50 mounted on the bottom plate 31 of the housing 30, and the bottom plate 31 of the housing 30, and mounted to the bottom plate 31 via the fastening members 41. The fifth modified embodiment provides advantageous effects equivalent to those of the first embodiment excluding the advantageous effect that is generated by mounting the compressor 40 on the strength member 50 in the first embodiment.

Figure 11:
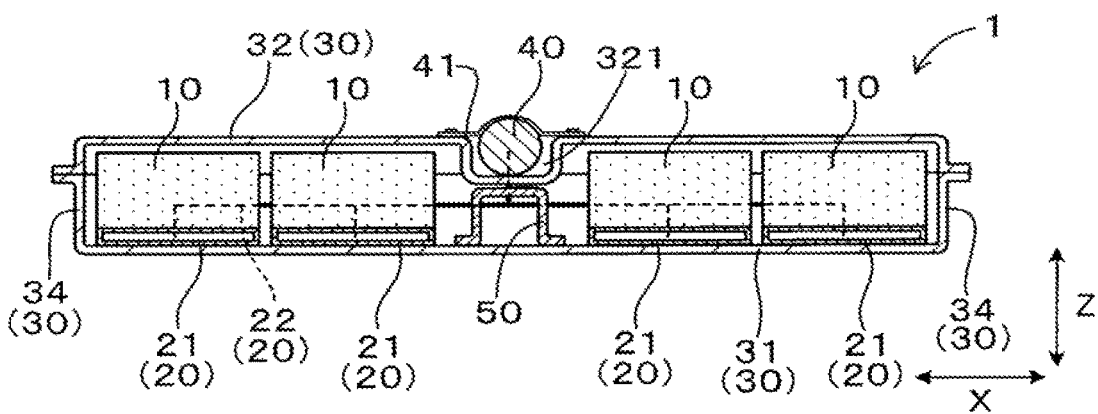
FIG. 11 is a cross-sectional view taken along a line corresponding to the line V-V of FIG. 4 according to a sixth modified embodiment.

As a sixth modified embodiment illustrated in FIG. 11, the compressor 40 may be mounted on an outer side surface of the top plate 32 of the housing 30. In the sixth modified embodiment, the top plate 32 has a recess portion 321 that is located in a position in which the top plate 32 and the strength member 50 are overlapped in the height direction Z and recessed inward of the housing 30 toward the strength member 50. The compressor 40 is disposed in the recess portion 321 and fixed by the fastening members 41. The sixth modified embodiment provides advantageous effects equivalent to those of the first embodiment excluding the advantageous effect that is generated by placing the compressor 40 in the housing 30 in the first embodiment.

As described above, the present embodiment and the modified embodiments provides the power supply system 1 in which while enlargement of the space for the placement of the power supply system 1 is suppressed, the strength of the housing is improved.

The present disclosure is not limited to the first embodiment and the modified embodiments described above, and may be applied to a variety of embodiments within the gist of the disclosure. For example, the strength member 50 of the second modified embodiment illustrated in FIGS. 6 and 7 may be applied to the third modified embodiment illustrated in FIG. 8, the fourth modified embodiment illustrated in FIG. 9, or the sixth modified embodiment illustrated in FIG. 11.

What is claimed is:

1. A power supply system, comprising:
a plurality of batteries;
a cooling portion through which a refrigerant for cooling the plurality of the batteries flows;
a housing that has a bottom plate, a top plate, and side walls that extend upright from a peripheral edge of the bottom plate to a peripheral edge of the top plate, the housing accommodating the plurality of the batteries and the cooling portion; and
a compressor configured to pump the refrigerant to the cooling portion, wherein in the housing, a strength member, that is disposed between batteries in the plurality of batteries, is mounted on the bottom plate, wherein the strength member extends in a direction in which the side walls face each other and reinforces the housing,
wherein a height of the strength member from the bottom plate is smaller than a height of each of the batteries of the plurality of batteries from the bottom plate;
the compressor is disposed in a position in which the compressor and the strength member are overlapped in the upright direction of the side walls, and the strength member is configured to contact the side walls only when the side walls are deformed inward of the housing by an external force, which prevents the side walls from being further deformed,
wherein the compressor is accommodated in the housing, and located between the strength member and the top plate or between the strength member and the bottom plate.

2. The power supply system according to claim 1, wherein the plurality of the batteries are arranged on the bottom plate in a direction perpendicular to a direction in which the strength member extends,
the cooling portion includes:
a plurality of cooling pipes that are in contact with at least one of the plurality of the batteries; and
a cooling piping that is connected to the plurality of the cooling pipes and the compressor and through which the refrigerant flows to the cooling pipes to be circulated, and
the strength member is located between adjacent two of the batteries.

3. The power supply system according to claim 1, wherein the compressor is fixed to the strength member directly or via a bracket.

4. The power supply system according to claim 1, wherein the strength member and each of the batteries among the plurality of batteries are elongated in a first direction.

5. The power supply system according to claim 1, wherein the strength member has connecting portions that are disposed in opposite ends of a bent plate material in a second direction perpendicular to a first direction of the bent plate material, leg portions that are bent and extend upright in the height direction from the connecting portions that are disposed in the opposite ends, and an upper face portion that is bent inward of upper ends of the leg portions.

* * * * *